(12) United States Patent
Weichmann et al.

(10) Patent No.: US 12,191,630 B2
(45) Date of Patent: Jan. 7, 2025

(54) VERTICAL CAVITY SURFACE EMITTING LASER DEVICE WITH MONOLITHICALLY INTEGRATED PHOTODIODE

(71) Applicant: TRUMPF Photonic Components GmbH, Ulm (DE)

(72) Inventors: Ulrich Weichmann, Aachen (DE); Philipp Henning Gerlach, Ulm (DE); Susanne Weidenfeld, Weilheim (DE); Holger Joachim Moench, Vaals (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 641 days.

(21) Appl. No.: 17/539,266

(22) Filed: Dec. 1, 2021

(65) Prior Publication Data
US 2022/0094137 A1    Mar. 24, 2022

Related U.S. Application Data

(63) Continuation of application No. PCT/EP2020/062364, filed on May 5, 2020.

(30) Foreign Application Priority Data

Jun. 3, 2019  (EP) .................... 19177927

(51) Int. Cl.
*H01S 5/026*  (2006.01)
*H01S 5/042*  (2006.01)
(Continued)

(52) U.S. Cl.
CPC .......... *H01S 5/0262* (2013.01); *H01S 5/0421* (2013.01); *H01S 5/18347* (2013.01); *H01S 5/34313* (2013.01)

(58) Field of Classification Search
CPC ..... H01S 5/0262–0264; H01S 5/34313; H01S 5/18–18397; H01S 5/42–426
See application file for complete search history.

(56) References Cited

U.S. PATENT DOCUMENTS 5,136,603 A * 8/1992 Hasnain ................ H01S 5/0264
372/50.21
5,475,701 A * 12/1995 Hibbs-Brenner ... H01S 5/18341
372/50.21
(Continued)

FOREIGN PATENT DOCUMENTS

CN      1585216 A      2/2005
CN    105807378 A  *  7/2016  ........... G02B 6/4286
(Continued)

OTHER PUBLICATIONS

Grabherr, et al., "Integrated Photodiodes Complement the VCSEL Platform," *Proceedings of SPIE* 7229, pp. 72290E-72290E-9, Feb. 6, 2009, Society of Photographic Instrumentation Engineers, Bellingham, WA, USA.

*Primary Examiner* — Joshua King
(74) *Attorney, Agent, or Firm* — LEYDIG VOIT & MAYER LTD.

(57) ABSTRACT

A vertical cavity surface emitting laser device includes: an optical resonator; a photodiode; and a contact arrangement. The optical resonator includes two distributed Bragg reflectors (DBRs) and an active region between the DBRs. The photodiode has a light absorption region in the optical resonator. The contact arrangement provides drive current to pump the optical resonator, and contacts the photodiode. The active region has an $In_xGa_{1-x}As$ layer, where $0 \leq x < 1$. The light absorption region has an $In_yGa_{1-y}As$ layer, where $0 < y < 1$, and $y > x$. The $In_yGa_{1-y}As$ layer is an intrinsic layer of the light absorption region. The $In_yGa_{1-y}As$ layer is 15-50 nm thick. The light absorption region has an undoped layer
(Continued)

with a material different from the $In_yGa_{1-y}As$ layer. The $In_yGa_{1-y}As$ layer is immediately adjacent to the undoped layer. An intrinsic zone of the light absorption region is at least 70 nm thick.

13 Claims, 4 Drawing Sheets

(51) Int. Cl.
    *H01S 5/183* (2006.01)
    *H01S 5/343* (2006.01)

(56) References Cited

U.S. PATENT DOCUMENTS

| | | | | |
|---|---|---|---|---|
| 5,577,064 A * | 11/1996 | Swirhun | ............... | H01S 5/0424 |
| | | | | 257/85 |
| 5,606,572 A * | 2/1997 | Swirhun | ............. | H01S 5/04256 |
| | | | | 257/85 |
| 5,757,837 A * | 5/1998 | Lim | ...................... | H01S 5/0264 |
| | | | | 372/98 |
| 5,914,976 A * | 6/1999 | Jayaraman | ............ | H01S 5/0262 |
| | | | | 372/50.21 |
| 5,943,357 A * | 8/1999 | Lebby | .................... | B82Y 20/00 |
| | | | | 372/50.21 |
| 5,974,071 A * | 10/1999 | Jiang | ..................... | H01S 5/0262 |
| | | | | 372/50.21 |
| 5,978,401 A | 11/1999 | Morgan | | |
| 6,026,108 A * | 2/2000 | Lim | ...................... | H01S 5/0264 |
| | | | | 372/28 |
| 6,055,262 A | 4/2000 | Cox et al. | | |
| 6,320,891 B1 * | 11/2001 | Seko | ...................... | B82Y 20/00 |
| | | | | 372/50.21 |
| 6,717,972 B2 * | 4/2004 | Steinle | ................... | H01S 5/183 |
| | | | | 372/50.1 |
| 7,277,463 B2 * | 10/2007 | Guenter | .............. | H01S 5/18308 |
| | | | | 372/50.21 |
| 7,746,911 B2 * | 6/2010 | Guenter | ................ | H01S 5/0264 |
| | | | | 372/50.1 |
| 8,467,428 B2 * | 6/2013 | Gerlach | .............. | H01S 5/18347 |
| | | | | 372/50.21 |
| 2003/0021322 A1 * | 1/2003 | Steinle | ................... | H01S 5/183 |
| | | | | 372/50.21 |
| 2005/0041714 A1 * | 2/2005 | Kim | ...................... | H01S 5/0264 |
| | | | | 372/50.21 |
| 2005/0041715 A1 * | 2/2005 | Kim | ................... | H01S 5/18308 |
| | | | | 257/E31.101 |
| 2006/0171437 A1 * | 8/2006 | Takahashi | .......... | H01S 5/18311 |
| | | | | 372/50.124 |
| 2010/0027578 A1 | 2/2010 | Takeuchi | | |

FOREIGN PATENT DOCUMENTS

| | | |
|---|---|---|
| JP | 2010040605 A | 2/2010 |
| KR | 20130090473 A1 | 8/2013 |
| WO | WO 2009136348 A1 | 11/2009 |

* cited by examiner

VERTICAL CAVITY SURFACE EMITTING LASER DEVICE WITH MONOLITHICALLY INTEGRATED PHOTODIODE

CROSS REFERENCE TO RELATED APPLICATIONS

This application is a continuation of International Application No. PCT/EP2020/062364 (WO 2020/244862 A1), filed on May 5, 2020, and claims benefit to European Patent Application No. EP 19177927.1, filed on Jun. 3, 2019. The aforementioned applications are hereby incorporated by reference herein.

FIELD

The present invention relates to a Vertical Cavity Surface Emitting Laser (VCSEL) device with monolithically integrated photodiode. The present invention further relates to an optical sensor comprising such a VCSEL device. Still further, the present invention relates to a method of producing such a VCSEL.

BACKGROUND

A VCSEL with monolithically integrated photodiode, commonly denoted as ViP, may be used in sensors for the measurement of, e.g., distances, displacements, or velocities. All these measurements may be based on the principle of self-mixing interference (SMI). Another application of VCSELs is the measurement of particle densities, which enables for example a measurement of air quality. Devices of this type might be simple enough to be even integrated in mobile phones.

Typically, ViPs are based entirely on the AlGaAs material system. A VCSEL device of this type is disclosed in WO 2009/136348 A1. The quantum well(s) of the active region of the optical resonator as well as the layer stack of the photodiode comprise AlGaAs and GaAs material.

U.S. Pat. No. 5,757,837 A discloses a VCSEL with an intracavity quantum well photodiode. This VCSEL device uses a quantum well photodiode layer stack and a quantum well layer stack in the active region of the optical resonator, both made of InGasAs material. A similar VCSEL is disclosed in U.S. Pat. No. 5,606,572 A. US 2003/0021322 A1 discloses a VCSEL with an photodetector having a thin absorption layer of InGaAs with an indium content of a few percent.

VCSELs based on the AlGaAs material system provide laser emission at a wavelength of about 850 nm. VCSELs using AlGaAs for the active region of the laser and GaAs for the photodiode do not allow for much longer emission wavelengths.

The present inventors have recognized that it may be desirable to provide ViPs, which are able to emit laser light in a wavelength range above 850 nm which is far less visible to the human eye so that essentially invisible sensors based on ViPs are available.

SUMMARY

In an embodiment, the present disclosure provides a vertical cavity surface emitting laser (VCSEL) device. The VCSEL includes: an optical resonator; a photodiode; and an electrical contact arrangement. The optical resonator includes: a first distributed Bragg reflector; a second distributed Bragg reflector; and an active region for light emission. The active region is arranged between the first distributed Bragg reflector and the second distributed Bragg reflector. The photodiode has a light absorption region arranged in the optical resonator. The electrical contact arrangement is arranged to provide an electrical drive current to electrically pump the optical resonator, and to electrically contact the photodiode. The active region has at least one $In_xGa_{1-x}As$ layer, where $0 \leq x < 1$. The light absorption region comprises at least one $In_yGa_{1-y}As$ layer, where $0 < y < 1$, and y is greater than x. The $In_yGa_{1-y}As$ layer of the light absorption region is an intrinsic layer of the light absorption region. The at least one $In_yGa_{1-y}As$ layer of the light absorption region has a thickness in a range from 15 nm to 50 nm. The light absorption region of the photodiode has at least one undoped further layer based on a material different from the $In_yGa_{1-y}As$ layer. The $In_yGa_{1-y}As$ layer is immediately adjacent to the further layer. An intrinsic zone of the light absorption region has a total thickness of at least 70 nm.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
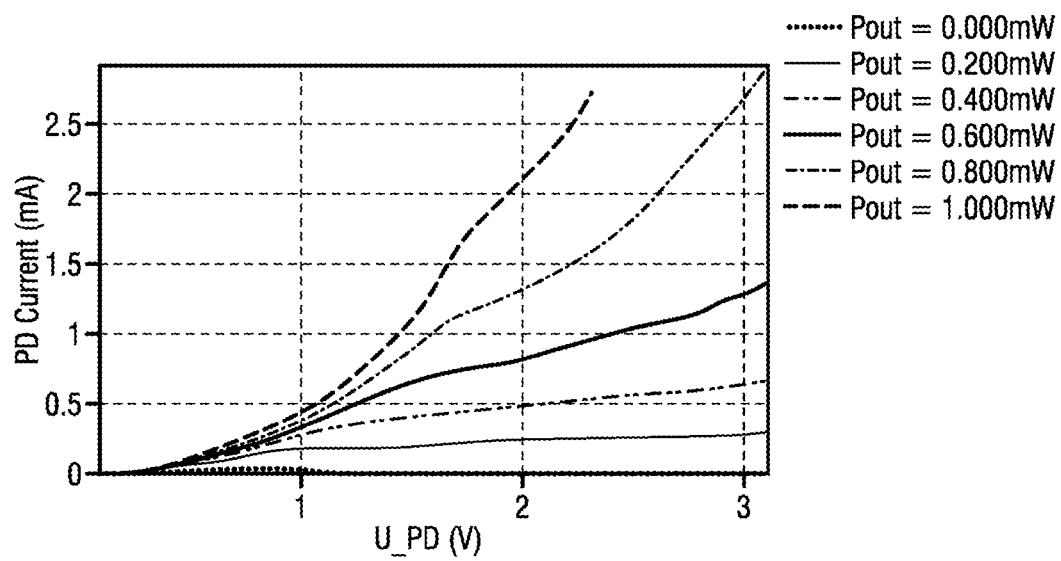
FIG. 1 shows a diagram of photodiode current curves as function of photodiode voltage for several output powers of the VCSEL.

Embodiments of the present invention provide an improved Vertical Cavity Surface Emitting Laser device with monolithically integrated photodiode, which enables laser light emission in a wavelength range above 850 nm, e.g. in a wavelength from 850 nm to 1200 nm.

Embodiments of the present invention provide an optical sensor with improved light detection characteristics and thus enabling more exact measurements with the sensor.

Embodiments of the present invention provide a method of producing a VCSEL with monolithically integrated photodiode.

According to a first aspect, a Vertical Cavity Surface Emitting Laser (VCSEL) device is provided, comprising an optical resonator, a photodiode, and an electrical contact arrangement. The optical resonator comprises a first distributed Bragg reflector (DBR), a second DBR and an active region for light emission. The active region is arranged between the first and second DBRs. The photodiode comprises a light absorption region. The electrical contact arrangement is arranged to provide an electrical drive current to electrically pump the optical resonator and to electrically contact the photodiode. The active region of the optical resonator comprises at least one $In_xGa_{1-x}As$ layer, wherein $0 \leq x < 1$, and the light absorption region of the photodiode comprises at least one $In_yGa_{1-y}As$ layer, wherein $0 < y < 1$, and wherein y is greater than x.

Using InGaAs or GaAs (x=0) as the material system for the active region of the optical resonator enables a VCSEL device which may provide laser light emission in a wavelength range above 850 nm. Using InGaAs as the material system for the light absorption region of the photodiode enables light detection in the for-mentioned wavelength range. By mixing indium arsenide (InAs) and gallium arsenide (GaAs), the band gap of the resulting indium gallium arsenide (InGaAs) can be set. The band gap depends on the ratio of indium content to gallium content in the compound semiconductor. The more indium content in comparison to gallium content in the compound semiconductor material, the lower is the band gap and, thus, the longer is the wavelength emitted by the VCSEL.

At first glance might appear to be straightforward to replace the GaAs-photodiode of the conventional VCSELs by a similar one based on InGaAs-material. However, attempts to do so resulted in a surprising behavior of the photodiode current, which exhibits a strong dependence on the photodiode voltage, in particular with increasing output power of the VCSEL. This unexpected behavior is undesired. Another undesired effect is an increased capacity of the InGaAs-based photodiode. It was found to be advantageous in a ViP in which the active region as well as the light absorption region are based on the InGaAs material system to provide the InGaAs layer in the light absorption region with an indium content which is higher than the indium content in the active region.

The higher indium content in at least one $In_yGa_{1-y}As$ layer of the light absorption region further advantageously increases the light absorption by the photo detector.

A difference y−x between indium content of the InGaAs-layer(s) in the light absorption region and indium content of the InGaAs-layer(s) in the active region may be in a range from 0.005 to 0.2. Preferably, the difference y−x may be in a range from 0.01 to 0.1. More preferably, the difference y−x may be in a range from 0.02 to 0.06.

The active region of the optical resonator may comprise one or more quantum wells comprising one or more $In_xGa_{1-x}As$ layers. x may be zero, i.e. the active region may comprise one or more GaAs layers. In other embodiments, x may be greater than zero, i.e. $0 < x < 1$. Each quantum well may comprise an $In_xGa_{1-x}As$ layer sandwiched between semiconductor layers having a larger band gap than the $In_xGa_{1-x}As$ layer.

The photodiode may be monolithically integrated with the VCSEL. In particular, the photodiode may be arranged in the optical resonator to form an intracavity monolithically integrated photodiode. Preferably, the photodiode may be incorporated into the first or second DBR. The $In_yGa_{1-y}As$ layer of the light absorption region is preferentially undoped. The $In_yGa_{1-y}As$ layer may thus form an intrinsic layer of a p-i-n photodiode structure which advantageously reduces the capacity of the photodiode.

The light absorption region of the photodiode may comprise at least one further undoped layer, wherein the $In_yGa_{1-y}As$ layer is immediately adjacent to the further layer. In combination with an intrinsic $In_yGa_{1-y}As$ layer of the light absorption region the intrinsic zone of the light absorption region may be thus increased which further helps to reduce the strong dependence of the photo current on the photodiode voltage and to reduce the capacitance of VCSEL.

Further, adding one or more intrinsic layers in the light absorption region based on a material different from the $In_yGa_{1-y}As$ layer is advantageous in comparison with increasing the thickness of the $In_yGa_{1-y}As$ layer, because the thickness of the $In_yGa_{1-y}As$ layer is limited by conditions for the epitaxial growth which does not allow thick layers with high indium content due to strain.

The at least one further undoped layer in the light absorption region of the photodiode may be a GaAs or a $GaAs_zP_{1-z}$ layer with $0 < z < 1$. z may be 0.9, for example. $GaAs_zP_{1-z}$ is advantageous as it partially compensates strain in the InGaAs-layer.

Further preferentially, the light absorption region of the photo detector may comprise at least two undoped (e.g. undoped GaAs or undoped $GaAs_zP_{1-z}$) layers, wherein the $In_yGa_{1-y}As$ layer is sandwiched by the further layers.

The light absorption region may comprise a single $In_yGa_{1-y}As$ layer.

Further preferentially, the light absorption region may comprise at least two $In_yGa_{1-y}As$ layers separated by at least one undoped further layer. In this way, the absorption of the photo detector can be advantageously further increased. The further layer may be an undoped GaAs or undoped $GaAs_zP_{1-z}$ layer.

The at least one $In_yGa_{1-y}As$ layer of the light absorption region may have a thickness in range from 15 nm-80 nm. The maximum thickness of the $In_yGa_{1-y}As$ layer which meets the conditions for epitaxial growth depends on the indium content of the $In_yGa_{1-y}As$-layer. The higher the indium content of the $In_yGa_{1-y}As$ layer, the less is the maximum thickness suitable for epitaxial growth of the layer stack. For example, for y being about 0.15 (15% indium content), a practical limit of the thickness of an $In_yGa_{1-y}As$-layer would be 20 nm-30 nm.

An intrinsic zone of the light absorption region may have a total thickness of at least 70 nm, preferably of at least 100 nm, further preferably of at least 200 nm. As indicated above, a thicker intrinsic zone of the light absorption region may further help to reduce the strong dependence of the photo current on the photodiode voltage and reduce the capacitance of the VCSEL.

One of the DBRs may have a first part and a second part, wherein the light absorption region including the $In_yGa_{1-y}As$ layer maybe arranged between the first part and the second part of that DBR. The one part of the first and second parts which is arranged closer to the active region than the other part of the DBR preferentially has at least two DBR layer pairs with different refractive indices, or may have four or even more DBR layer pairs.

The electrical contact arrangement may comprise a contact layer arranged between the active region and the light absorption region. The contact layer may be an n-contact layer. The contact layer is advantageous as it solves or at least reduces surface non-uniformity problems caused when etching the epitaxial layer stack down to the substrate for making the electrical contact, and also solves the problem of electrical contact resistance, when etching only down to a functional layer and making the electrical contact on the functional layer. In case the contact to be made is an n-contact, the contact layer may be an n-doped, low aluminum containing but still transparent layer. The contact layer may be thick enough to overcome the non-uniformity problem of the etching process. The contact layer may be arranged in the first or second DBR. In this case, the optical thickness of the contact layer should be an integer multiple of λ/2 so that the DBR is effectively divided into two parts by the contact layer, which two parts have reflectivity that add up in a constructive way. The phase of each DBR part is thus in-phase.

According to a second aspect, an optical sensor is provided, comprising a Vertical Cavity Surface Emitting Laser device of the first aspect.

The optical sensor may be comprised by a mobile communication device.

The optical sensor may be used for distance detection, velocity detection, particle density detection, gesture control, and especially for all sensor applications which are based on self-mixing interference measurements.

According to a third aspect, a method of producing a Vertical Cavity Surface Emitting Laser device is provided, comprising:
 providing a first distributed Bragg reflector and a second distributed Bragg reflector,
 providing an active region comprising at least one InxGa1-xAs layer, wherein 0≤x<1, for light emission and arranging the active region between the first and second distributed Bragg reflectors to form an optical resonator,
 providing a photodiode comprising a light absorption region with at least one InyGa1-yAs layer, wherein 0<y<1, wherein y is greater than x,
 electrically contacting the optical resonator, and
 electrically contacting the photodiode.

The steps need not be performed in the order given above. The different layers of the first and second DBRs, the active region and the photo detector may be deposited by epitaxial methods like MOCVD, MBE and the like.

The VCSEL device may comprise a substrate onto which the layer stack of the VCSEL with integrated photodiode is grown. The substrate may be removed after the VCSEL device is produced.

The VCSEL device may be a top emitter or a bottom emitter.

It shall be understood that the VCSEL device according to any embodiment described above and the method of producing the VCSEL device have similar and/or identical embodiments, in particular, as defined in the independent claim. Further advantageous embodiments are defined below.

It shall be understood that the preferred embodiment of the invention can also be any combination of the dependent claims with the respective independent claims.

In the following, exemplary embodiments of a Vertical Cavity Surface Emitting Laser device with monolithically integrated photodiode (ViP) based on the InGaAs material system will be described. Conventionally, ViPs are based entirely on the AlGaAs material system to provide laser emission at a wavelength of about 850 nm, with quantum wells based on GaAs or AlGaAs and a photodiode based on GaAs. Using the AlGaAs material system, much longer emission wavelengths than 850 nm are not possible. Using InGaAs material may solve this problem in view of the lower band gap of InGaAs in comparison with the band gap of AlGaAs. It might appear to be straight forward to replace a GaAs-photodiode by a similar one based on InGaAs material. However, a surprising behavior of the photodiode current (PD current) was observed. The PD current may exhibit a strong dependence on the photodiode voltage U_PD. FIG. 1 shows this surprising behavior of the PD current as function of the photodiode voltage U_PD for several output powers Pout of the VCSEL from 0 mW to 1 mW for a photodiode based on InGaAs and an emission wavelength of 850 nm. The voltage-dependence of the photodiode current is the more significant the higher the output power of the VCSEL is.

The present disclosure provides a VCSEL with monolithically integrated photodiode, in which both the active region of the VCSEL as well as the photodiode are based on the InGaAs material system for light emission and detection, preferably in a wavelength range from 850 to 1200 nm.

Figure 2:
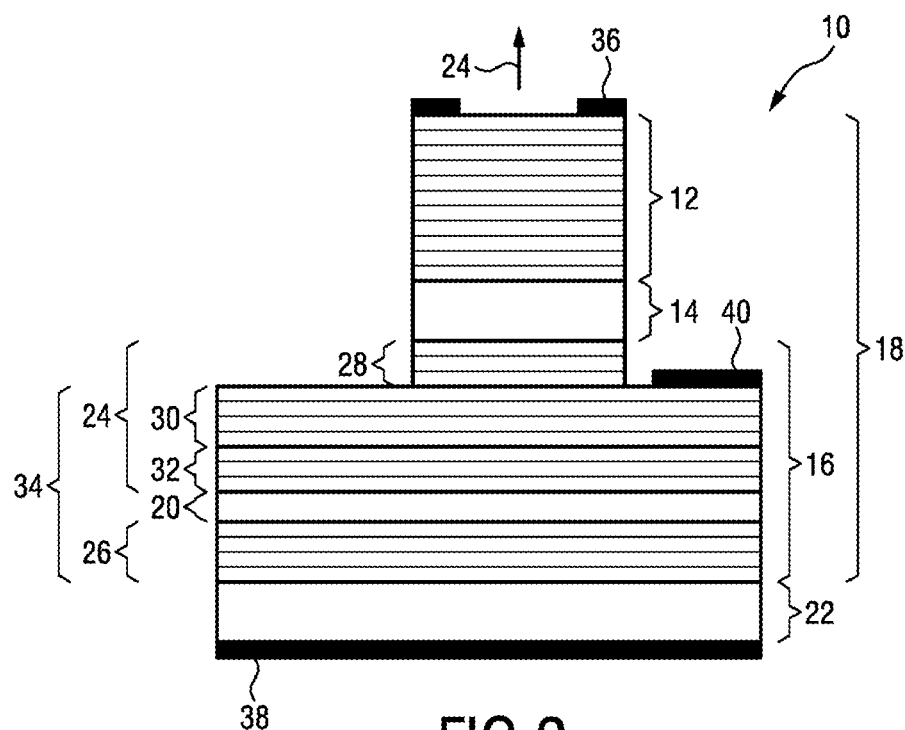
FIG. 2 a schematic view of a first embodiment of a VCSEL device.

FIG. 2 shows a first embodiment of a VCSEL device 10 according to the principles of an embodiment of the invention. The VCSEL device 10 comprises a first distributed Bragg reflector (DBR) 12, an active region 14 for laser light emission, and a second distributed Bragg reflector (DBR) 16. The active region 14 is arranged between the first and second DBRs 12, 16. The first DBR 12, the active region 14 and the second DBR 16 form an optical resonator 18. The VCSEL device 10 further comprises a photodiode 34 having a light absorption region 20.

The layer stacks of the first DBR 12, the active region 14, the second DBR 16 and the light absorption region 20 of the photodiode may be epitaxially grown on a substrate 22. The layers of the first and second DBRs 12, 16 may comprise doped AlGaAs material.

In case the VCSEL device 10 is a top emitter, the first DBR 12 may be partly transmissive for the laser radiation generated in the active region 14. The laser light is emitted by the VCSEL device 10 as illustrated by an arrow 24. The first DBR 12 may have a reflectivity of about 98%, for example. The second DBR 16 may have a reflectivity of ≥99%. It is to be understood that in other embodiments, the VCSEL device 10 may be configured as a bottom emitter, i.e. laser light is emitted on the substrate side of the VCSEL device 10, wherein the reflectivity of the first DBR 12 may be ≥99% and the reflectivity of the second DBR 16 may be about 98% in case of a bottom emitter. The substrate 22 may be removed in further embodiments. In further embodiments, the light absorption region/layer 20 may be arranged in the top of the second DBR 16. In still further embodiments, the light absorption region 20 may be arranged in the first DBR 12 of a top emitter or in the second DBR 16 of a bottom emitter.

Each of the first and second DBRs 12, 16 may have one or more layer pairs, wherein each layer pair has different indices of refraction. The number of layers shown in FIG. 2 is only schematic and exemplary and not limiting. The thickness of the layers shown in FIG. 2 is not to scale and only schematic and exemplary.

The optical resonator 18 may further comprise one or more oxide apertures in the VCSEL of the VCSEL device.

The light absorption region 20 of the photodiode 34 is embedded in the second DBR 16, thus dividing the second DBR 16 in a first part 24 and a second part 26.

The substrate 22 and the second part 26 of the second DBR 16 may be n-doped. The first part 24 of the second DBR 16 may have an n-doped first region 28, an n-doped second region 30, and a p-doped third region 32. The n-doped second region 30, the p-doped third region 32, the light absorption region 20, which preferably is an intrinsic (undoped) region, and the n-doped second part of the second DBR 16 build up the photodiode 34. Thus, the photodiode 34 may be an n-p-i-n photodiode formed by the light absorption region 20 and the layers of the regions 30, 32, 26 of the second DBR 16.

The VCSEL device 10 further comprises an electrical contact arrangement, which may comprise a p-contact 36 on top of the first DBR 12, an n-contact 38 on the bottom of the substrate 22, and a further n-contact 40 on top of the region 28 of the second DBR 16. The p-contact 36 may be formed as a ring electrode. The p-contact 36 may be arranged on a cap layer (not shown) on top of the first DBR 12. The n-contact 38 may be formed as a metallization of the bottom of the substrate 22. In case the VCSEL device 10 is designed as a bottom emitter, the n-contact 38 may be formed as a ring electrode.

The p-contact 36 may form the anode of the VCSEL, and the n-contact 40 may form the cathode of the VCSEL. At the same time, the n-contact 40 may form the anode of the photodiode 34, while the n-contact 38 may form the cathode of the photodiode 34.

The active region 14 comprises at least one $In_xGa_{1-x}As$ layer, wherein $0 \leq x < 1$. In an example, x may be 0.1, thus the $In_xGa_{1-x}As$ layer may be of a composition $In_{0.1}Ga_{0.9}As$, therefore containing 10% indium in this example. $In_{0.1}Ga_{0.9}As$ may provide laser emission at about 950 nm at a temperature of about 300 K. Longer wavelengths may be obtained by using InGaAs material with higher indium content. x may be in a range from 0 or 0.1 to 0.35, for example to achieve laser light emission in a desired wavelength range. The photoluminescence peak of the active region 14 with $In_{0.1}Ga_{0.9}As$ is at a shorter wavelength than the emission wavelength of the VCSEL and may be at about 925 nm. The active layer 14 may comprise several quantum wells of $In_xGa_{1-x}As$ of only several nm thickness. For example, a thickness in a range from 5 nm to 10 nm, e.g. a thickness of 8 nm may be appropriate. x may be zero, i.e. the active region may comprise one or more GaAs quantum wells.

The light absorption region 20 of the photodiode 34 also comprises at least one $In_yGa_{1-y}As$-layer. The indium content of the $In_yGa_{1-y}As$-layer is higher than the indium content of the $In_xGa_{1-x}As$-layer, and may be, in the above example of an $In_{0.1}Ga_{0.9}As$ active region 14, an $In_{0.145}Ga_{0.855}As$-layer, thus having an indium content of about 14.5%.

In general, a difference y−x of the indium content of the InGaAs-layers in the active region 14 and the light absorption region may be in a range from 0.005 to 0.2, preferably in a range from 0.01 to 0.1, further preferably in a range from 0.02 to 0.06.

A single $In_yGa_{1-y}As$-layer in the light absorption region 20 may have a thickness in a range from 15 nm-80 nm. The maximum thickness of the $In_yGa_{1-y}As$ layer is limited by conditions for the epitaxial growth which do not allow thick layers with high indium content due to strain. A practical limit would be 20 nm-30 nm for the above example of an indium content of about 14.5%.

While the light absorption region 20 of the photodiode 34 may be just made of a single thin intrinsic InGaAs-layer, a thicker intrinsic zone may be used as the light absorption region 20 in a preferred embodiment.

Figure 3:
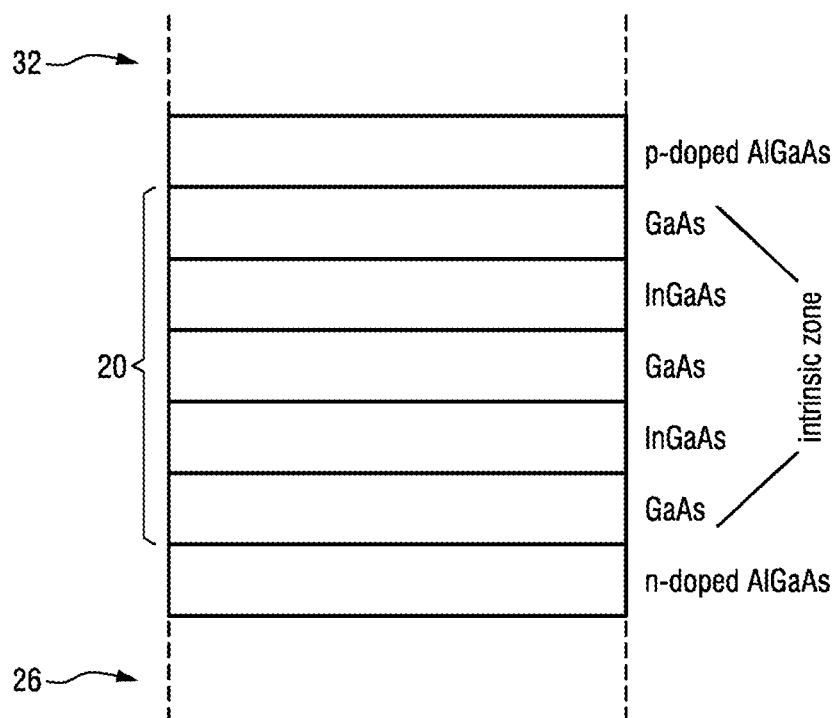
FIG. 3 a schematic view of a part of a layer stack of the photodiode of the VCSEL device in FIG. 2, FIG. 4 a schematic view of a second embodiment of a VCSEL device.

FIG. 3 shows such an embodiment of the light absorption region 20 embedded between the p-doped third region 32 of the second DBR 16 and the n-doped second part 26 of the second DBR 16. The third region 32 and the second part 26 are only shown in part in FIG. 3. As shown in FIG. 3, the light absorption region 20 of the photodiode 34 comprises an intrinsic zone comprising two intrinsic InGaAs-layers which may have an indium content of 14.5%, for example. The intrinsic zone further comprises three further undoped layers which in this example may comprise undoped GaAs-layers. Thus, undoped material, e.g. GaAs or $GaAs_zP_{1-z}$ with z=0.9, is preferably added around one or more InGaAs-layers such that the total thickness of the intrinsic material is at least 70 nm, more preferred 100 nm, and even more preferred 200 nm. Such a thick intrinsic zone might seem to be counter-intuitive, but the thicker intrinsic zone can help to reduce the strong dependence of the photocurrent on the photodiode voltage and to reduce the capacitance of the VCSEL. Further, using more than one InGaAs-layers for the light absorption region 20 helps to increase the absorption of the photodiode 34. Using GaAsP instead of GaAs for the layers in the intrinsic zone has the additional advantage that the strain that has built up in the InGaAs-layer is partially compensated.

The InGaAs-layer or layers may be arranged alternating with the further undoped layers as shown in FIG. 3 so that an InGaAs-layer is embedded or sandwiched between two undoped further layers and immediately adjacent to the undoped further layers.

Returning to FIG. 2, the third region 32 of the first part 24 of the second DBR 16 preferably comprises at least 2 DBR layer pairs, more preferred 4 or even more DBR layer pairs. This may further reduce the voltage-dependence of the photodiode current.

The transition between the third region 32 and the first region 28 of the first part 24 of the second DBR is preferably designed such that the last p-doped layer of the third region 32 is with a high aluminum content or a layer where the aluminum content is gradually decreased from high values to low values.

Figure 4:
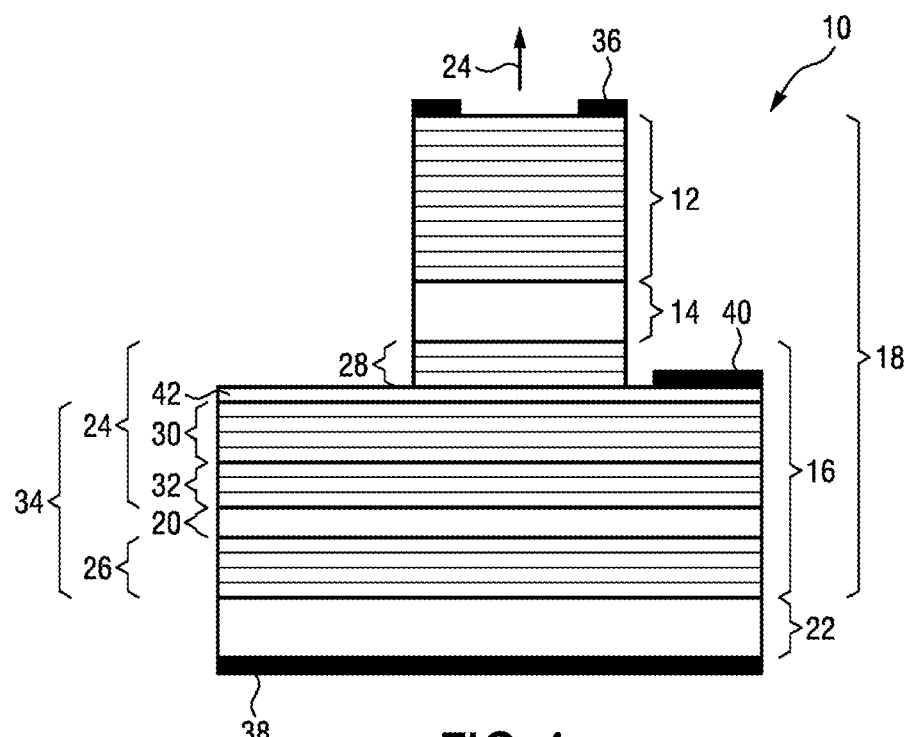

FIG. 4 shows a further embodiment of a VCSEL device 10, wherein elements of the VCSEL device 10 in FIG. 4 which are identical, similar or comparable with respective elements of the VCSEL device 10 in FIG. 2 are denoted with the same reference numerals.

The difference between the VCSEL device 10 in FIG. 4 and the VCSEL device 10 in FIG. 2 is a contact layer 42 between the first region 28 and the second region 30 of the first part 24 of the second DBR 16. The contact layer 42 is an n-contact layer. The optical thickness of the contact layer 42 preferably is an integer multiple of $\lambda/2$ so that the second DBR 16 is effectively divided into two sections (regions 28 and regions 30, 32 and 26) which have reflectivity that add up in a constructive way. The phase of each of the DBR sections is in-phase so that not a second resonator is formed.

The contact layer 42 may have a low aluminum content, but is still transparent to the light emitted by the VCSEL.

The term "intrinsic layer", "intrinsic zone" or "intrinsic material", etc. as used herein is to be understood as being a layer, zone or material which is without any significant dopant species level present in the layer, zone or material. The same holds for the term "undoped" which means not having any significant dopant species level.

Figure 5:
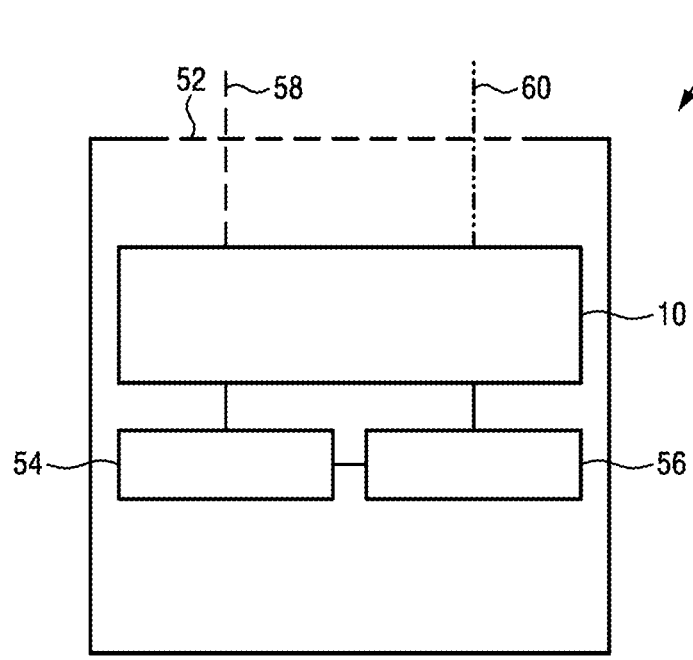
FIG. 5 shows a schematic view of an optical sensor.

FIG. 5 shows a sketch of an optical sensor 50 according to an embodiment. The optical sensor 50 is arranged to determine presence, distances and movements of objects by means of self-mixing interference measurements. The optical sensor 50 comprises a VCSEL device 10 as described above, a transmission window 52 and a driving circuit 54 for electrically driving the VCSEL device 10. The driving circuit 54 is electrically connected to the VCSEL device 10 via the contacts 36 and 40 to supply electrical power to the VCSEL device 10 in a defined way. The driving circuit 54 may comprise a memory device for storing data and instructions to operate the driving circuit 54. The optical sensor 50 further comprises an evaluator 56. The photodiode 34 comprised by the VCSEL device 10 is arranged to determine variations in the standing wave pattern within the laser cavity coupled to the respective photodiode. The evaluator 56 may comprise at least one memory device like a memory chip and at least one processing device like a microprocessor. The evaluator 56 is adapted to receive electrical signals from the VCSEL device 10 and optionally from the driving circuit 54 to determine distances or movements of one or more objects based on the interference of laser light 58 which is reflected by the respective objects as reflected laser light 60 and the optical standing wave within the optical resonator of the VCSEL (self-mixing interference). The optical sensor 50 may be used for particle detection, distance/velocity measurements, user interfaces, etc.

Figure 6:
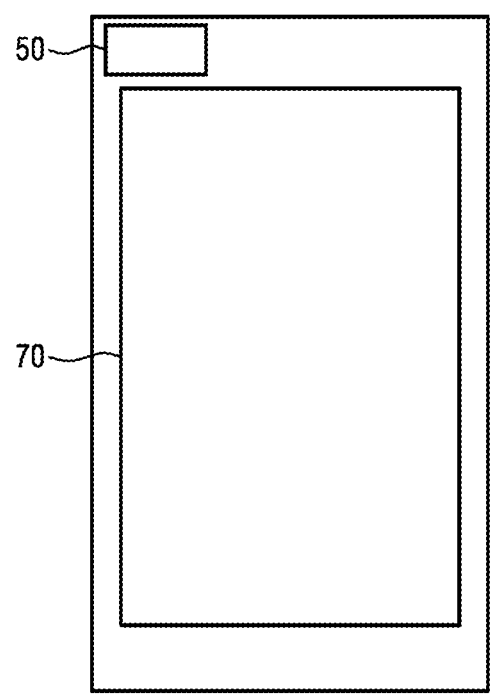
FIG. 6 shows a principle sketch of a mobile communication device comprising the optical sensor.

FIG. 6 shows a sketch of a mobile communication device 70 comprising an optical sensor 50. The optical sensor 50 can, for example, be used in combination with the software application running on the mobile communication device 70. The software application may use the optical sensor 50 for sensing applications. Such sensing applications may, for example, be self-mixing interference measurement applications, particle sensing applications or an application of a gesture based user interface.

Figure 7:
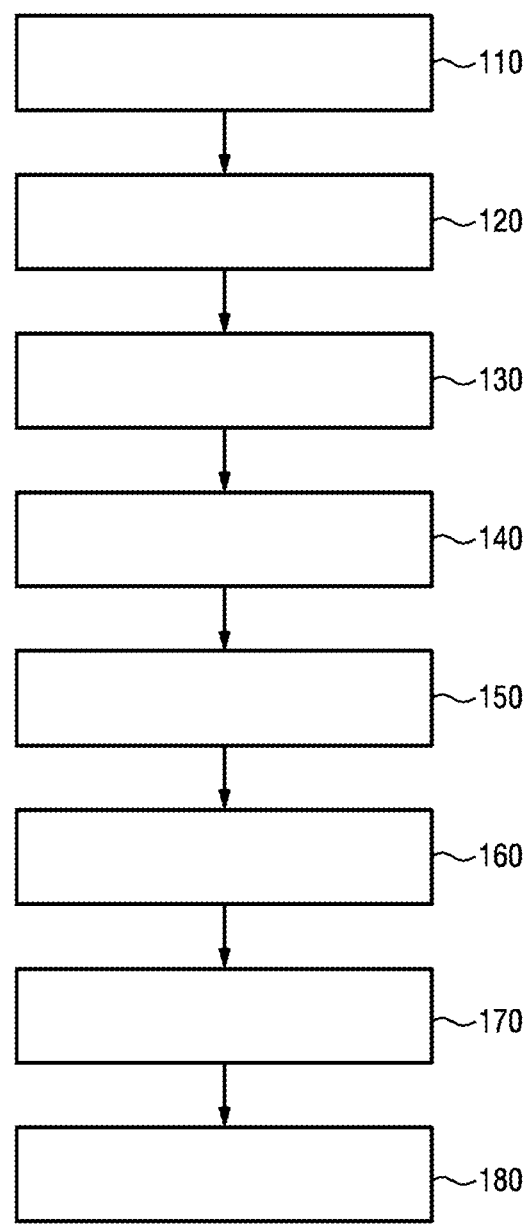
FIG. 7 shows a principle sketch of a process flow of a method of producing a VCSEL device.

FIG. 7 shows a principle sketch of a process flow of a method of producing a VCSEL device according to the present invention. In step 110, a substrate (substrate 22 in FIGS. 1 and 2) is provided. In step 120, the second part 26 of a second DBR 16 as described above is provided on the substrate 22. In step 130, a light absorption region 20 as described above is provided on the second part 26 of the second DBR 16.

In step 140, third and second regions 32 and 30 of a first part 24 of the second DBR 16 as described above are provided on the light absorption region 20. In optional step 150, a contact layer 42 is provided on the second region 30 of the first part 24 of the second DBR 16. In step 160, a first region 28 of the first part 24 of the second DBR 16 is provided on the second region 30 or the contact layer 42. In step 160, an active region 14 as described above is provided on the first region 28 of the first part 24 of the second DBR 16. In step 170, the optical resonator 18 comprising the first and second DBRs 12, 16 and the active region 14 is electrically contacted as described above. In step 180 the photodiode 34 comprising the second and third regions 30, 32 of the first part 24 of the second DBR 16, the light absorption region 20 and the second part 26 of the second DBR 16 is electrically contacted as described above.

The active region 14 is provided comprising at least one $In_xGa_{1-x}As$ layer, wherein $0 \le x < 1$, for light emission. The light absorption region 20 of the photodiode 34 is provided with at least one $In_yGa_{1-y}As$-layer, wherein $0 < y < 1$, wherein y is greater than x.

Electrically contacting may comprise one or more steps of etching down the layer structure of the VCSEL device with an appropriate etching technology to the respective layer of the second region 30 of the first part 24 of the second DBR 16 or to the contact layer 42. The process may further comprise an oxidation process in order to provide an oxide aperture in the VCSEL of the VCSEL device. The production process may further comprise a passivation or planarization process to provide a smooth surface for depositing bond pads. The substrate 22 may be removed after depositing the semiconductor layers of the VCSEL structure. The n-contact 38 of the photodiode 34 may be provided after thinning or grinding the substrate 22 on the thinned backside of the substrate 22.

The layers of the first DBR, the active region and any other layers as current injection layers and alike may be deposited by epitaxial methods like MOCVD or MBE.

While embodiments of the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A vertical cavity surface emitting laser (VCSEL) device, the VCSEL device comprising: an optical resonator; a photodiode; and an electrical contact arrangement, wherein the optical resonator comprises: a first distributed Bragg reflector; a second distributed Bragg reflector; and an active region for light emission, wherein the active region is arranged between the first distributed Bragg reflector and the second distributed Bragg reflector, wherein the photodiode comprises a light absorption region arranged in the optical resonator, wherein the electrical contact arrangement is arranged to provide an electrical drive current to electrically pump the optical resonator, and to electrically contact the photodiode, wherein the active region comprises at least one $In_xGa_{1-x}As$ layer, wherein $0 \le x < 1$, wherein the light absorption region comprises at least one $In_yGa_{1-y}As$ layer, wherein $0 < y < 1$, wherein y is greater than x, wherein the at least one $In_yGa_{1-y}As$ layer of the light absorption region is an intrinsic layer of the light absorption region, wherein the at least one $In_yGa_{1-y}As$ layer of the light absorption region has a thickness in a range from 15 nm to 50 nm, wherein the light absorption region of the photodiode comprises at least one undoped further layer based on a material different from the at least one $In_yGa_{1-y}As$ layer, wherein the at least one $In_yGa_{1-y}As$ layer is immediately adjacent to the further layer, and wherein an intrinsic zone of the light absorption region has a total thickness of at least 70 nm.

2. The VCSEL device of claim 1, wherein a difference y−x is in a range from 0.005 to 0.2.

3. The VCSEL device of claim 1, wherein the at least one undoped further layer of the light absorption region of the photodiode comprises at least two undoped further layers, wherein the at least one $In_yGa_{1-y}As$ layer is sandwiched by the at least two undoped further layers.

4. The VCSEL device of claim 1, wherein the at least one $In_yGa_{1-y}As$ layer comprises at least two $In_yGa_{1-y}As$ layers separated by the at least one undoped further layer.

5. The VCSEL device of claim 1, wherein the at least one further layer comprises GaAs or $GaAs_zP_{1-z}$.

6. The VCSEL device of claim 1, wherein the at least one $In_yGa_{1-y}As$ layer comprises single $In_yGa_{1-y}As$ layer.

7. The VCSEL device of claim 1, wherein an intrinsic zone of the light absorption region has a total thickness of at least 100 nm.

8. The VCSEL device of claim 1, wherein an intrinsic zone of the light absorption region has a total thickness of at least 200 nm.

9. The VCSEL device of claim 1, wherein the electrical contact arrangement comprises a contact layer arranged between the active region and the light absorption region in one of the first distributed Bragg reflector or the second distributed Bragg reflector.

10. The VCSEL device of claim 9, wherein an optical thickness of the contact layer is an integer multiple of half of the wavelength of the laser light in the optical resonator.

11. An optical sensor, comprising the VCSEL device of claim 1.

12. A method of producing a vertical cavity surface emitting laser device, the method comprising: providing a first distributed Bragg reflector and a second distributed Bragg reflector, providing an active region comprising at least one $In_xGa_{1-x}As$ layer, wherein $0 \leq x < 1$, for light emission and arranging the active region between the first distributed Bragg reflector and the second distributed Bragg reflector to form an optical resonator, providing a photodiode comprising a light absorption region arranged in the optical resonator with at least one $In_yGa_{1-y}As$ layer, wherein $0 < y < 1$, wherein y is greater than x, electrically contacting the optical resonator, and electrically contacting the photodiode, wherein the at least one $In_yGa_{1-y}As$ layer of the light absorption region is an intrinsic layer of the light absorption region, wherein the at least one $In_yGa_{1-y}As$ layer of the light absorption region has a thickness in a range from 15 nm to 50 nm, wherein the light absorption region of the photodiode comprises at least one undoped further layer based on a material different from the at least one $In_yGa_{1-y}As$ layer, wherein the at least one $In_yGa_{1-y}As$ layer is immediately adjacent to the further layer, and wherein an intrinsic zone of the light absorption region has a total thickness of at least 70 nm.

13. The VCSEL device of claim 2, wherein the difference y−x is in a range from 0.01 to 0.1 or from 0.02 to 0.06.

* * * * *